United States Patent [19]

Collings

[11] 4,144,511
[45] Mar. 13, 1979

[54] PUSH-BUTTON MECHANISMS AND EQUIPMENT INCLUDING THEM

[75] Inventor: Frederick J. Collings, Hertford, England

[73] Assignee: Smiths Industries Limited, London, England

[21] Appl. No.: 789,584

[22] Filed: Apr. 21, 1977

[30] Foreign Application Priority Data

Apr. 21, 1976 [GB] United Kingdom ............... 16089/76

[51] Int. Cl.² ............................................. H03J 5/32
[52] U.S. Cl. ..................................... 334/7; 74/10.27;
74/10.39; 200/18; 334/74
[58] Field of Search ............... 334/7, 50, 53; 200/5 E,
200/153 P, 18; 74/10.1, 10.15, 10.2, 10.27,
10.39, 10.9

[56] References Cited
U.S. PATENT DOCUMENTS

| 1,489,580 | 4/1924 | Lucey | 200/5 E UX |
| 2,296,060 | 9/1942 | Schwarz et al. | 74/10.39 X |
| 2,356,935 | 8/1944 | Koch | 334/7 |
| 2,521,968 | 9/1950 | De Tar et al. | 334/53 |
| 3,487,702 | 1/1970 | Hosch et al. | 334/7 X |
| 3,602,051 | 8/1971 | Olah | 74/10.39 X |

Primary Examiner—Paul L. Gensler
Attorney, Agent, or Firm—Pollock, Vande Sande & Priddy

[57] ABSTRACT

A push-button mechanism for tuning a radio receiver includes push-buttons that are actuable to rotate a turrent tuner to different extents for station selection. The side of each push-button contacts one end of an individual lever to pivot it through a predetermined angle upon actuation of the push-button. The other end of the lever contacts one of several projections on a bar which extends transversely of the push-buttons and which is coupled via rack and pinion gearing to the drum of the turret tuner. The levers of the different push-buttons have different orientations with respect to the bar so that although each lever is pivoted through the same angle, longitudinal displacement of the bar effected, and hence the setting of the turret tuner, depends upon which push-button is actuated. Upon actuation of a push-button, the bar is locked in its displaced position by means of a leaf spring, and the drum is then locked in position by means of a projection that engages in one of several notches in the drum. The mechanism has a shuttle that is coupled to a wave-band switch for switching the radio receiver between long-wave and medium-wave bands appropriate to the push-button actuated.

8 Claims, 3 Drawing Figures

PUSH-BUTTON MECHANISMS AND EQUIPMENT INCLUDING THEM

This invention relates to push-button mechanisms. The invention is particularly, but not exclusively, concerned with push-button mechanisms suitable for use in the provision of a tuning mechanism for a radio receiver.

A push-button tuner mechanism is known, for example from U.K. Patent Specification No. 1,306,437, in which a single push-button is used for tuning. The push-button is coupled to a drum that is rotatable from one to another of a plurality of angular positions to change the tuning from one to another of a corresponding number of pre-selected stations. Actuation of the push-buttons is effective to step the drum on from one angular position to the next and thereby changes the tuning to the next, adjacent station. However there is the significant disadvantage that change between non-adjacent stations requires repeated actuation, by depression and release, of the push-button. It is one object of the present invention to provide a push-button mechanism that may be used to enable this disadvantage to be overcome.

More particularly, it is an object of the present invention to provide a push-button mechanism having a plurality of push-buttons so as to enable, in the context of a tuner, tuning to any one of a plurality of preselected stations to be achieved by single push-button operation. Push-button mechanisms having a plurality of push-buttons have been proposed and utilized heretofore, but it is an object of the present invention to provide such a mechanism of a form that enables a high degree of compactness to be achieved.

According to one aspect of the present invention, a push-button mechanism comprises a plurality of individually-actuable push-button means, rotatable output means, and means coupling the push-button means to the said output means to rotate the said output means to different angular positions according to which of the push-button means is actuated. The said coupling means may comprise a first member mounted for linear displacement, means coupling the said first member to said output means to rotate said output means to a position dependent on the extent of linear displacement of said first member, and a plurality of second members associated respectively with said push-button means, the said second members being responsive to actuation of their respective push-button means to effect linear displacement of said first member to an extent dependent upon which of the push-button means is so actuated.

The same extent of stroke may be applicable to actuation of each push-button, and in this respect the said second members may conveniently be pivotally-mounted levers. The levers may be orientated differently with respect to the said first member to effect different extents of linear displacement of the first member when pivoted upon actuation of their respective push-button means.

Although the push-button mechanism of the present invention is especially applicable to the provision of a push-button tuner mechanism for a radio, or television, the invention is not limited to such application. The mechanism may find application, for example, in machine tools, and in this respect may be utilized for push-button selection of the operative tool, in a turret lathe.

A push-button mechanism in accordance with the present invention for use in selective tuning of a radio receiver, will now be described, by way of example, with reference to the accompanying drawings, in which.

Figure 1:
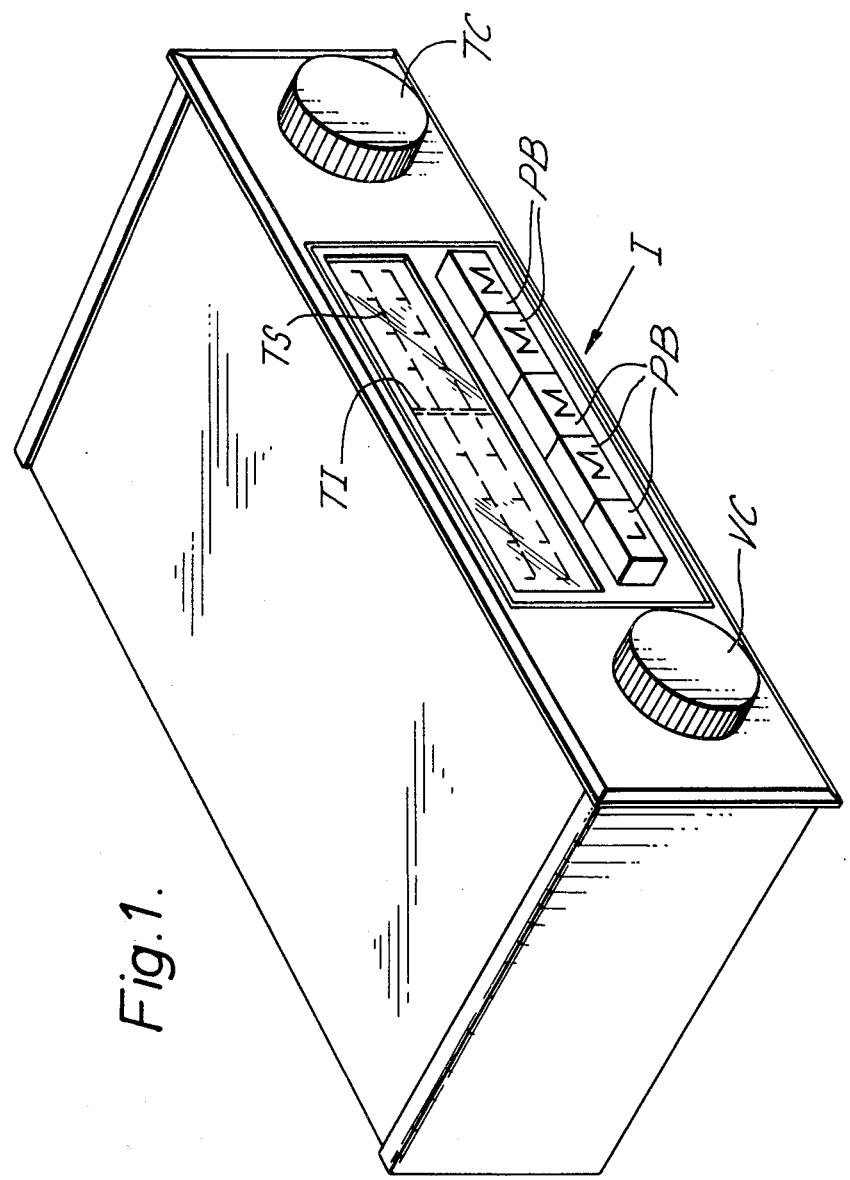
FIG. 1 is a perspective view of a radio receiver including the push-button tuner mechanism of the invention.

Referring to FIG. 1, a radio receiver, particularly for use in a motor vehicle, has a row of five push-buttons PB that are located below a tuning scale TS between conventional manual controls TC and VC for adjustment of the tuning and volume respectively. An index TI is positioned along the scale TS in accordance with the tuning of the receiver, and such tuning can be changed directly to receive any one of five pre-selected stations simply by actuation of one of the five push-buttons PB, the particular one of the five stations to which the receiver is thereby tuned being dependent on which push-button PB is actuated. Four of the push-buttons PB, marked 'M', are for tuning to stations in the medium-wave band, whereas the fifth push-button PB, marked 'L', is for tuning to a station in the long-wave band, however the push-button mechanism could easily be modified for use with different numbers of buttons or for use solely in the medium-wave, long-wave or VHF bands, or for any combination of these.

Figure 2:
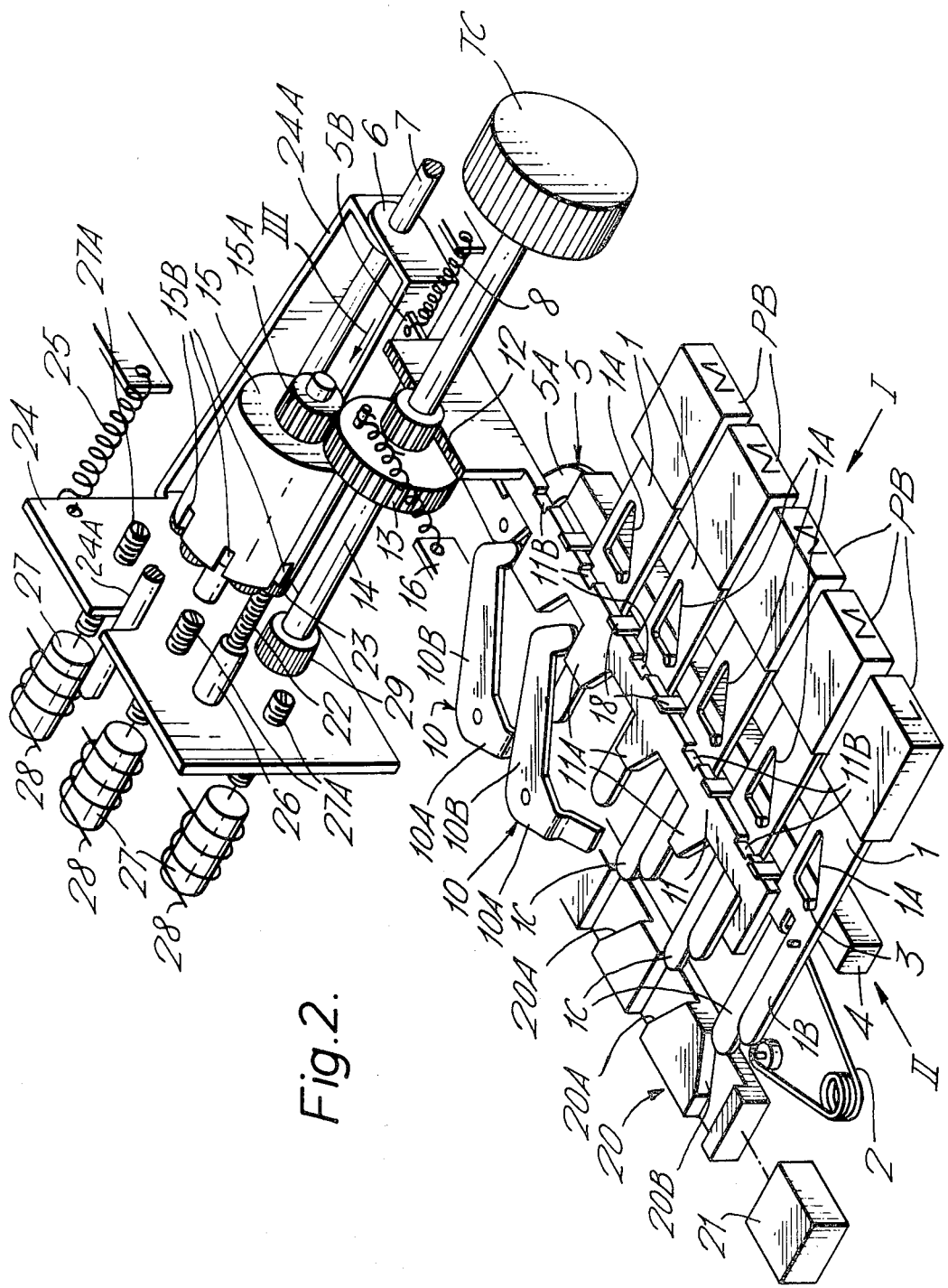
FIG. 2 is a perspective view of part of the push-button tuner mechanism.
Figure 3:
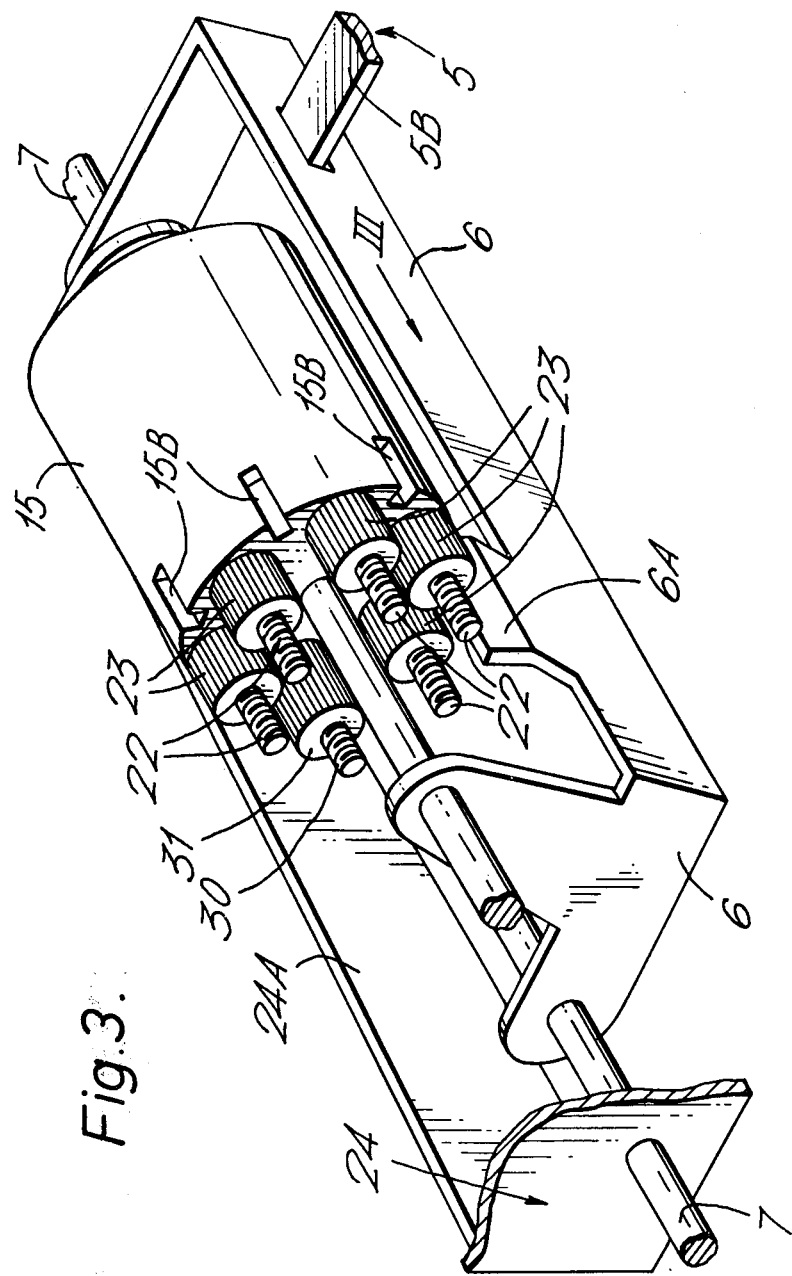
FIG. 3 is a perspective view of part of the mechanism of FIG. 2.

Referring now to FIG. 2, each push-button PB is mounted at the forward end of an individual one of five identical push-slides 1 that are arranged side by side. The slides 1, which are each mounted for longitudinal displacement against the bias of an individual spring 2, are slotted so that each provides an inclined surface 1A that is engaged by an individual one of five pegs 3 carried by a bar 4. The bar 4 extends transversely to the slides 1 and at one end abuts one arm 5A of a bell-crank 5. The other arm 5B of the crank 5 projects into an opening in a lock-slide 6 that is carried on, and is slidable along, a rod 7 (see particularly FIG. 3). The bell-crank 5 is biased into the position shown in FIG. 2, by a spring 8 acting on the arm 5B.

The slides 1 each have a rearwardly-extending tongue 1B that engages a limb 10A of an individual and separately-pivoted lever 10 (only some of which are shown), when the slide 1 is displaced longitudinally upon actuation of its push-button PB. Another limb 10B of the lever 10 engages one edge of an individual one of five lateral projections 11A of a rigid bar 11 that extends transversely of the slides 1. The bar 11 carries a rack 12 that engages with gearing 13 which is rotatably mounted on the shaft 14 of the control TC and which meshes with a pinion 15A on a rotatable drum 15. The gearing 13 is biased by a spring 16 which provides torque opposing clockwise displacement of the shaft 14, and which thereby urges the bar 11 towards the right hand side of the slides 1 as seen in FIG. 2.

Each slide 1 carries an upwardly-extending leaf spring 18 that engages a respective one of five non-uniformly spaced slots 11B in the bar 11, while the push-button PB of that slide 1 is being actuated. A rearwardly-extending tongue 1C of the slide 1 at the same time engages an inclined surface 20A or 20B (depending on whether the relevant push-button is M or L) of a longitudinally-displaceable shuttle 20 that extends transversely of the slides 1.

Initial movement of the relevant slide 1 upon actuation of any one of the push-buttons PB (by depression in the direction of the arrow I) causes the bar 4 to be displaced in the direction of the arrow II to engage the arm 5A of the bell-crank 5. This displaces the lock-slide 6 rearwardly, in the direction of the arrow III. Continued movement of the slide 1 urges the tongue 1B of that slide against the arm 10A of the associated lever 10 thereby pivoting this lever 10 in a clockwise direction as viewed from above in FIG. 2. The other arm 10B of the lever 10 acting on the respective projection 11A, accordingly displaces the bar 11 in the direction opposite to that of the arrow II. The distance by which the bar 11 is displaced depends upon which of the push-buttons PB is actuated.

The same extent of longitudinal displacement is available to each slide 1 so that the same extent of depression is applicable to each push-button PB. However the resulting longitudinal displacement of the bar 11 depends upon the initial orientation of the lever 10 by which the displacement is transmitted to the bar 11. The projections 11A engaged by the arms 10B of the levers 10 are non-uniformly spaced along the bar 11 so that the levers 10 have different initial orientations. Thus although they all rotate through the same angle upon actuation of their respectively associated push-buttons PB, different displacements of the bar 11 are achieved, according to which of them is actuated.

Displacement of the bar 11 causes the gearing 13 to rotate the drum 15 through an angle dependent on the extent of that displacement and thereby on which of the push-buttons PB is being actuated. Return of the drum 15 and bar 11 under the action of the spring 16 at this time, is resisted by engagement of the leaf spring 18 associated with the actuated push-button in its adjacent slot 11B.

Continued rearward displacement of the slide 1 causes its tongue 1C to engage with the inclined surface 20A or 20B of the shuttle 20. The shuttle 20 is coupled to a wave-change switch 21 for switching between the medium-wave and long-wave bands. Upon actuation of the push-button marked 'L' the tongue 1C on the slide 1 engages with the inclined surface 20B on the shuttle 20 so as thereby to urge it in the direction of the arrow II so that the switch 21 is set to select the long-wave band. If on the other hand any one of the push-buttons marked M is actuated, the tongue 1C of the relevant slide 1 engages the respective inclined surface 20A urging the shuttle 20 in the opposite direction to set the switch 21 to select the medium-wave band.

The drum 15 forms part of the tuner of the radio receiver, and in this respect carries six, screw-threaded rods 22 that project from its rear face. Each rod 22 carries a nut 23 arranged such that rotation of the nut causes the rod 22 to move longitudinally into or out of the drum 15. A plate 24 is urged by a spring 25 along guide rod 24A towards the drum 15 so that a projection 26 on the plate 24 abuts the end of one of the rods 22, the particular one depending on the angular displacement of the drum 15. The cores 27 of radio tuning-coils 28 are attached to the plate 24 so that movement of the plate 24 towards or away from the drum 15, and therefore of the core 27 into and out of the fixed coils 28, varies the tuning of the receiver. Each core 27 is attached to the core-carriage plate 24 by means of an associated screw 27A which is screwed into the plate 24 so as to enable the position of each core 27 within its associated coil 28 to be readily pre-set.

The shaft 14 carries at its rear end a pinion 29 that is engageable with the nut 23 on whichever of the rods 22 abuts the projection 26. Engagement of the pinion 29 with this nut 23 is effected by pulling the tuning control TC, and thereby the shaft 14, outwards from the receiver.

In each of the angular positions of the drum 15 corresponding to a screwed rod 22, there is a notch 15B formed in the outer surface at the rear end of the drum 15. This notch 15B is engaged by a projection 6A (FIG. 3) on the lock-slide 6. Movement of the bar 4 upon actuation of any one of the push-buttons PB causes the slide 6 to be displaced rearwardly in the direction of the arrow III, thereby causing the projection 6A to be withdrawn from the engaged notch 15B. As the slide 6 is displaced rearwardly along the rod 7 its forward end abuts a bracket 24A of the core-carriage plate 24. The plate 24 and its projection 26 are thus moved away from the rods 22 carried by the drum 15, thereby freeing the drum 15 for angular displacement in appropriate accordance with the particular push-button PB actuated.

As the actuated push-button PB is allowed to return to its rest position under the action of the spring 2, the slide 6 is moved forwardly by the bar 4 under the action of its spring 8. The projection 6A enters an appropriate notch 15B to lock the drum 15 in position, and the core-carriage plate 24 at the same time moves forwardly to bring the projection 26 into engagement with the relevant rod 22. The final return movement of the push-button PB withdraws the leaf spring 18 from the slot 11B in the bar 11, thus permitting the bar 11 to return to its original position under the action of its spring 16.

A screwed rod 30 which carries a nut 31 (FIG. 3), is provided on the drum 15 in addition to the five screwed rods 22 corresponding to the five push buttons PB. The rod 30 is brought into alignment with the projection 26 when the drum 15 rotates to the angular position to which it is biased by the spring 16. The drum 15 is freed to rotate to this position by pushing the tuning control TC, and thereby the shaft 14, inwardly in the direction of the arrow I. The shaft 14 abuts a portion (not shown) of the slide 6 and the core-carriage plate 24 so that the inward movement of the control TC causes both the slide 6 and plate 24 to move rearwardly away from the drum 15, disengaging the projection 6A and thereby freeing the drum to rotate under the influence of the spring 16 to align the rod 30 with the projection 26. As the drum 15 is displaced by the spring 16 so the bar 11 is driven via the gearing 13 and rack 12 to the limit of its travel in the direction of the arrow II.

The shaft 14 returns to its normal position when pressure on the control TC is reduced, and this moves the core-carriage plate 24 and the slide 6 towards the drum 15 so as to bring the projection 26 into abutment with the aligned rod 30 and the projection 6A into appropriate engagement with a notch 15 to restrain rotation of the drum 15. The pinion 29 at the same time engages the nut 31 (which is longer than any nut 23), and this accordingly enables adjustment of the rod 30 to be made by rotation of the shaft 14, so that in this position tuning can be effected directly by rotation of the tuning control TC.

One of the advantages of the mechanism described is that the arrangement by which the push-buttons PB are coupled to the drum 15 may be readily of very compact form. The push-button mechanism is therefore particularly advantageous in the provision of a combined radio receiver and tape player having overall dimensions small enough to enable it to be fitted in the normal aperture provided in motor vehicles to receive a radio receiver alone.

The mechanism may be modified to enable actuation of any one of the push-buttons PB to tune the receiver to either of two pre-selected stations, the particular tuning achieved depending on the extent to which the push-button is depressed. In this respect, five additional screwed rods corresponding to the screwed rods 23 are provided on the drum 15, so that each is brought in turn into alignment with the projection 26 upon partial depression, say half-way, of the respective push-buttons PB. Depression of the push-buttons PB may be restricted to the half-way or other intermediate position, by means of a stop member that is engaged or disengaged (to allow the full extent of depression) by a separate control which would also be effective when engaged to re-position the leaf springs 18.

I claim:

1. A push-button mechanism comprising a plurality of individually-actuable push-button means, rotatable output means, and means coupling the push-button means to the said output means to rotate the said output means to different angular positions according to which of the push-button means is actuated, said coupling means comprising a first member mounted for linear displacement, means coupling the said first member to said output means to rotate said output means to a position dependent on the extent of linear displacement of said first member, and a plurality of pivotally mounted levers associated respectively with said push-button means, each said lever being arranged for pivotal movement about an axis fixed relative to said mechanism upon actuation of its respective push-button means, the extent of said pivotal movement being dependent on the extent of actuation of said respective push-button means, and each said lever having an arm for engaging said first member so that pivotal movement of said lever is communicated to said first member to effect linear displacement thereof the extent of which is dependent upon the extent of said pivotal movement, so that actuation of said push-button means is thereby communicated to said first member through pivotal movement of the subject lever, and so that the extent of displacement of said first member is dependent upon which of the push-button means is so actuated.

2. A push-button mechanism according to claim 1 wherein said levers are pivotally mounted to have different orientations with respect to the said first member whereby different ones of the levers effect different extents of linear displacement of the said first member for the same extent of pivotal movement.

3. A push-button mechanism according to claim 2 wherein said first member has a plurality of projections spaced apart at different distances from one another along the length of said first member and wherein each said lever engages an individual one of said projections for effecting said linear displacement of said first member.

4. A push-button mechanism according to claim 1 including locking means, means mounting said locking means with said push-button means for engaging said first member upon actuation of said push-button means.

5. A push-button mechanism according to claim 1 wherein said output means is a drum of a turret tuner.

6. A push-button mechanism according to claim 5 wherein said turret tuner is a tuner of a radio receiver and wherein said mechanism includes a shuttle member, means coupling said push-button means to said shuttle member for effecting linear displacement of said shuttle member, a wave-band switch for effecting switching between wave-bands of the said radio receiver, means coupling said shuttle member to said switch for effecting said switching upon actuation of said push-button means.

7. A push-button mechanism comprising a plurality of push-button means, means mounting each said push-button means for linear displacement, a drum, means mounting said drum for angular displacement about its axis, a plurality of levers, each said lever having a first and second arm, means mounting each said lever for pivotal displacement with said first arm positioned for engagement with an individual one of said push-button means, a first member having a plurality of projections spaced apart at different distances from one another along its length, means mounting said first member to extend transverse to said push-button means and with each of said projections positioned for engagement with an individual one of said second arms, means mounting said first member for displacement along its length such that displacement of each said push-button means effects displacement of said first member to a different extent, means coupling said first member to said drum to effect angular rotation of said drum upon displacement of said first member, latching means actuable to restrain rotation of said drum, means coupling said latching means to said push-button means such as to release said drum for angular displacement upon displacement of an individual one of said push-button means.

8. A push-button mechanism according to claim 7 including a tuning assembly, said tuning assembly supporting cores, tuning coils, means connecting said tuning coils in a tuning circuit of a radio receiver, means mounting said tuning assembly with said tuning cores moveable within said tuning coils, a plurality of abutment rods, means mounting said abutment rods on said drum with said rods extending parallel to the axis of said drum and spaced apart about said axis, means mounting said tuning assembly for alignment with an individual one of said rods, means urging said tuning assembly into abutment with said individual rod so as thereby to effect positioning of said cores in said coils and hence tuning of said circuit, and adjustment means for adjusting the length of the said rods extending from said drum.

* * * * *